(12) United States Patent
Liao

(10) Patent No.: US 9,118,272 B2
(45) Date of Patent: Aug. 25, 2015

(54) LIGHT TRAPPING PHOTOVOLTAIC CELLS

(75) Inventor: Wen P. Liao, Clifton Park, NY (US)

(73) Assignee: Momentive Performance Materials Inc., Waterford, NY (US)

( * ) Notice: Subject to any disclaimer, the term of this patent is extended or adjusted under 35 U.S.C. 154(b) by 738 days.

(21) Appl. No.: 12/877,346

(22) Filed: Sep. 8, 2010

(65) Prior Publication Data

US 2012/0055537 A1    Mar. 8, 2012

(51) Int. Cl.
| | | |
|---|---|---|
| H01L 31/042 | (2014.01) | |
| H01L 31/0236 | (2006.01) | |
| H01L 31/0352 | (2006.01) | |
| H01L 31/054 | (2014.01) | |

(52) U.S. Cl.
CPC ............ *H02S 20/00* (2013.01); *H01L 31/0236* (2013.01); *H01L 31/02363* (2013.01); *H01L 31/02366* (2013.01); *H01L 31/035281* (2013.01); *H01L 31/0547* (2014.12); *Y02E 10/52* (2013.01)

(58) Field of Classification Search
CPC .................. H01L 31/02366; H01L 31/02363; H01L 31/0236; H01L 31/035281
USPC ......................................................... 136/255
See application file for complete search history.

(56) References Cited

U.S. PATENT DOCUMENTS

| | | | |
|---|---|---|---|
| 4,128,732 A * | 12/1978 | Kaplow et al. ................ | 136/246 |
| 4,352,948 A * | 10/1982 | Kaplow et al. ................ | 136/249 |
| 4,376,228 A | 3/1983 | Fan et al. | |
| 4,514,581 A | 4/1985 | Fan et al. | |
| 4,918,030 A | 4/1990 | Lamb et al. | |
| 7,109,517 B2 * | 9/2006 | Zaidi ............................... | 257/22 |
| 2006/0292369 A1 | 12/2006 | Rutledge et al. | |
| 2007/0104922 A1* | 5/2007 | Zhai et al. ...................... | 428/141 |
| 2008/0072958 A1* | 3/2008 | Dutta ............................. | 136/256 |
| 2008/0221263 A1 | 9/2008 | Kanagasabapathy et al. | |
| 2008/0241408 A1 | 10/2008 | Cumberland | |
| 2008/0250978 A1 | 10/2008 | Baumgart et al. | |
| 2008/0268233 A1 | 10/2008 | Lawin et al. | |
| 2008/0286556 A1 | 11/2008 | D'urso et al. | |
| 2008/0289684 A1 | 11/2008 | Moslehi | |

(Continued)

FOREIGN PATENT DOCUMENTS

JP               08046227 A    *   2/1996

OTHER PUBLICATIONS

Bravo, "Transparent Superhydrophobic Films Bases on Silica Nanoparticles", Apr. 2007, Langmuir, vol. 23, pp. 7293-7298.*

(Continued)

*Primary Examiner* — Devina Pillay
(74) *Attorney, Agent, or Firm* — Joseph E. Waters, Esq.; McDonald Hopkins, LLC

(57) ABSTRACT

A light trapping photovoltaic cell comprising a plurality of cells connected with walls wherein the cells have a plurality of generally straight vertical walls and a bottom region adjacent the generally vertical walls. The bottom region of the cells is pitched toward the center of the bottoms. The light trapping cells provide a structure that allows for improved absorption of incident light. Optionally, a light trapping photovoltaic cell may further comprise a hydrophobic protective layer such as, for example, may be provided by a plurality of nano-sized bumps on the surfaces of the cell walls. Additionally, the cells may exhibit other properties including, for example, deicing, anti-fouling, and self-cleaning.

20 Claims, 2 Drawing Sheets

(56) References Cited

U.S. PATENT DOCUMENTS

2009/0196990 A1    8/2009  Simpson et al.
2009/0211632 A1*   8/2009  Brett et al. .................. 136/256
2010/0071760 A1*   3/2010  Kwok et al. ................. 136/256

OTHER PUBLICATIONS

Yong Chae Jung and Bharat Bhushan, Wetting transition of water droplets on superhydrophobic patterned surfaces, Scripta Materialia 57 (2007) 1057-1060.

* cited by examiner

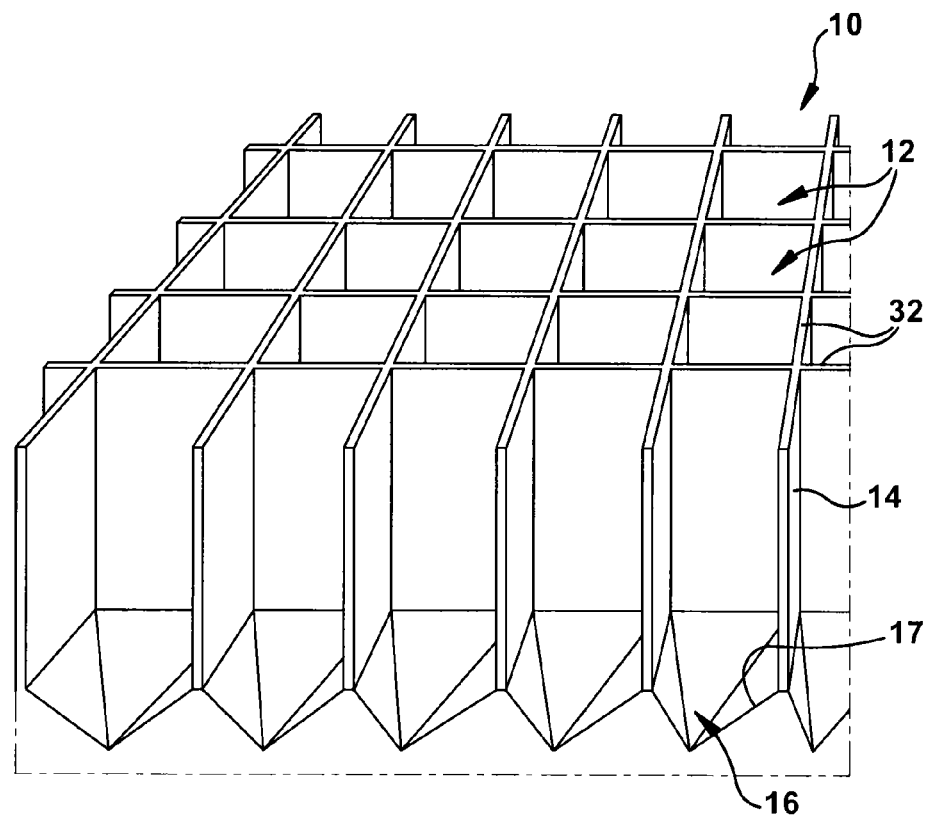
Figure 1
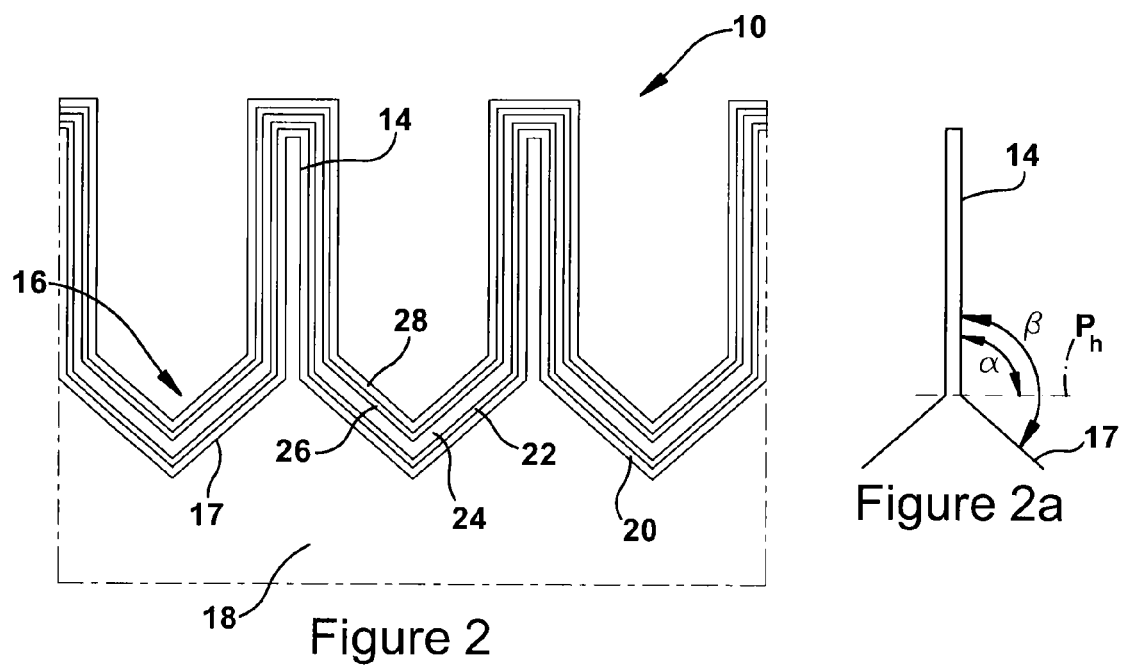
Figure 2
Figure 2a

LIGHT TRAPPING PHOTOVOLTAIC CELLS

This application relates to solar cells and more particularly to light trapping photovoltaic cells.

BACKGROUND

U.S. Pat. No. 4,376,228 and U.S. Pat. No. 4,514,581 disclose V-like or U-like troughs solar cells with an ultra thin active semiconductor layer. Lights transmitted through the active layer without being absorbed is reflected out to enter the semiconductor layer at another point where the lights are given another opportunity to be absorbed and converted to electrical energy. U.S. Publication No. 2008/0289684 discloses a high efficiency thin film solar cell using 3-D crystalline silicon (c-Si) film as an absorber layer in conjunction with a plurality of polygonal pyramid-shaped unit cells. The pyramid-shaped structure together with a reflective rear mirror provides a front-side and rear-side light trapping mechanism.

U.S. Pat. No. 4,918,030 describes a light trapping technology employing a pyramid shaped texture at the photovoltaic active silicon level. A metal oxide solution was used to chemically etch the semiconductor surface to create a distribution of pyramids in random orientations and sizes.

The previously disclosed pyramid, V-shaped and U-shaped troughs, however, are not sufficiently effective in light trapping. In particular, these previous designs are not capable of anti-fouling, anti-icing, or self-cleaning.

SUMMARY

In one aspect, the invention provides an apparatus and method to improve the efficiency of photovoltaic cells to convert solar energy to electricity. In another aspect, the invention provides an apparatus and method to improve solar energy conversion yield, to prevent fouling, and to provide self-cleaning and anti-icing to solar cells. In still another aspect, the invention further provides an apparatus and method of minimizing the waste of solar energy due to reflection and reducing cost by minimizing the thickness of the active semiconductor layer. In yet another aspect, the invention also provides the method of reducing the directional dependency of the cell surface.

BRIEF DESCRIPTION OF THE DRAWINGS

Embodiments of the present disclosure are described herein with reference to the drawings wherein:

FIG. 1 illustrates a perspective view of one embodiment of a cellular structure with photovoltaic components coated over a plurality of cells;

FIG. 2 illustrates a cross sectional view of one embodiment of a cellular structure with photovoltaic components coated over a plurality of cells;

FIG. 2a illustrates a portion of the cell wall and shows the orientation of the cell walls with respect to one another.

DETAILED DESCRIPTION OF THE PREFERRED EMBODIMENTS

Figure 3:
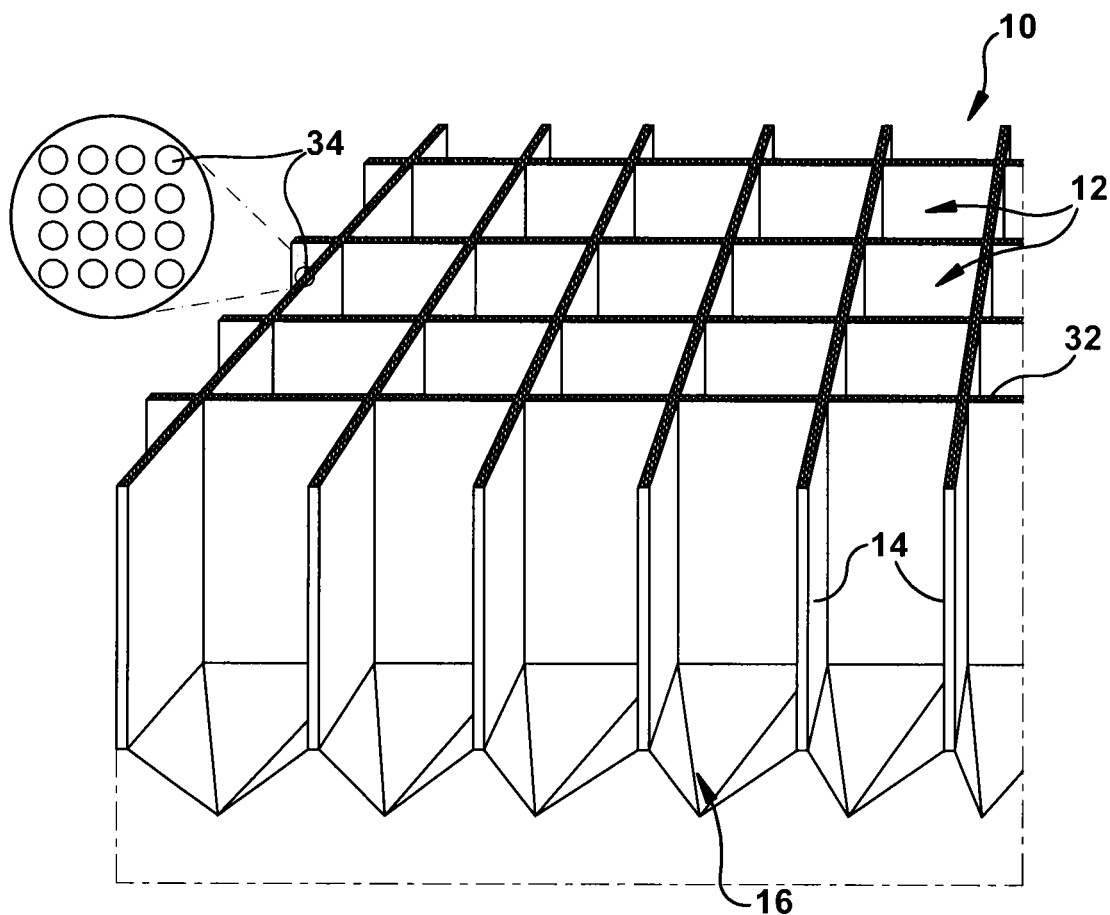
FIG. 3 illustrates a perspective view of another embodiment of a cellular structure with photovoltaic components coated over a plurality of cells and having a secondary texture of nano-sized bumps on the surface of the primary texture.

Reference will now be made in detail to embodiments of the invention, examples of which are illustrated in the accompanying drawings. It is to be understood that other embodiments may be utilized and structural and functional changes may be made without departing from the respective scope of the invention.

Referring to FIGS. 1 and 2, a light trapping photovoltaic solar cell in accordance with one aspect of the present invention has a cellular structure 10 comprising photovoltaic components coated continuously over a plurality of cells 12 that are tightly connected with thin walls. The cells 12 may resemble, for example, wells defined by a plurality of walls 14 and a bottom region 16 adjacent to the walls 14. In the embodiment in FIG. 1, the walls 14 are generally vertical and the bottom region 16 of the cells is generally provided such that the bottom region is pitched inwardly away from the vertical orientation. The bottom region 16 is generally defined by the wall or walls 17 adjacent to the walls 14. As shown in FIG. 1, the bottom region 16 of the cells may be pitched toward the center of the cell bottom. In one embodiment, the walls 17 may meet at a point as shown in the figures. In another embodiment, the bottom region may have a generally flat bottom surface area, and the walls 17 would converge to a side of that bottom surface respectively. In still another embodiment, the bottom region may have a rounded shape with the lowest point at or near the center. The cell has a top and a top surface defined by the generally vertical walls, and a bottom and a bottom surface defined by a wall or walls defining the bottom region.

In one embodiment as illustrated in FIG. 2, a substrate 18 is molded with the cellular structure 10 and is coated in sequence with a reflective layer 20, rear-side electrode 22, photovoltaic active layer 24, front-side electrode 26, and hydrophobic protective surface 28. Any of the above layers may be conformingly coated to retain the cellular structure. In one embodiment, all of the above layers 20, 22, 24, 26, 28 are conformingly coated to retain the cellular structure.

Cells 12 having a well-type structure in accordance with aspects of the invention ensure that incident light encounters the interior walls (14, 17) of the cells 12 multiple times. Thus, solar lights have multiple opportunities to be absorbed by the photovoltaic active layer 24. When incident light enters a cell it may be reflected before reaching the photovoltaic active layer, be absorbed by the photovoltaic active semiconductor, or penetrate through all layers and be reflected by the back-side reflector 20. The present invention provides a structure that gives solar energy from the incident light entering the cell 12 multiple opportunities to be absorbed at the surfaces of the cell 12 and thereby allows a greater amount of solar energy to be converted into electricity (as compared to flat surface solar cells in which a large amount of light may be refracted).

The more incident light that reaches the active semiconductor layers, the more light will be absorbed and converted to electricity. The frequency of the light touches on the interior surfaces of a cell depends on the geometry of the cell. In one embodiment, light having angles of incidences that are not normal to the cell plane are to first touch the walls on one side of the cells 12. Light that is not absorbed will be further reflected to the opposing walls or to bottom surface(s) of the cells, and the light that is still not absorbed will continue to be further reflected. The unabsorbed light will then bounce between the walls 14 and the bottom wall(s) of bottom region 16 of the cell many times before either finally being absorbed or leaving the cell 12. Since the bottom region 16 of the cells is pitched toward the center, the light coming in at about a right angle to the cell plane will also be reflected multiple times within the cells 12. The substantially vertical walls 14 maximize the frequency of the light encountering a surface of the cell. Applicants have found that a cell structure having a combination of vertical walls and a pitched or tapered bottom region/surface provides improved light trapping and improves the efficiency of photovoltaic cells to convert solar energy to electricity. Providing any slant of a wall 14 away from a vertical alignment reduces the number of reflections.

The configuration of the cells is not particularly limited, and the cells may be shaped and sized to suit a particular purpose or use. The cells may have a perimeter shape chosen from any regular or non-regular shape including, but not limited to, circular, square, rectangular, pentagonal, hexagonal, heptagonal, octagonal, and the like. In one embodiment, the respective dimensions of the cells (e.g., diameter, length, width, height, etc.) may be individually chosen to be from about 1 to about 1,000 microns. The height of the generally vertical walls may also be chosen as desired. Desirably, the thickness of the wall 14 is substantially uniform over the height of the wall.

As described above, the bottom region is pitched toward the bottom of the cells. The bottom region may be pitched to a point defining a bottom of the cell. The bottom region may be defined by a plurality of walls each extending from a vertical wall and pitching or tapering to a point. In one embodiment, the bottom region pitches toward a point located approximately at the geometric center in relation to the perimeter shape of the cell. In another embodiment, the bottom region may have a rounded shape with the lowest point being located approximately at the center of the cells perimeter. The angle or degree to which the bottom region is pitched away from the generally vertical wall may be chosen as desired to sufficiently reflect the light to the vertical wall. Applicants have found that larger angles or degrees of pitch may provide improved or greater absorption of light in the cell. This includes reflecting light that comes in perpendicular to the solar cell, which may not initially reach or contact the vertical walls. Referring to FIG. 2a, the vertical wall 14 may be provided such that it defines an angle ($\alpha$) with a plane ($P_h$) horizontal to the cell structure. In one embodiment, the angle $\alpha$ is about 90°. The cells may be provided such that the vertical walls 14 and walls 17 define an angle ($\beta$). The angle $\beta$ may be for example, from about greater than 90° to less than about 180°. Larger angles $\beta$ have been found to be particularly suitable for providing greater or improved light absorption.

In one embodiment, a substrate 18 molded with a cellular structure 10 may be manufactured by an embossing process or other similar processes. A mold that has a negative impression of the cellular structures may be made by lithographical etching or other methods known to one skilled in the art. A negative impression, sometimes called a master impression, may also be made by imprinting from another mold (with a positive impression) fabricated by chemical etching or any other suitable methods. Cellular textures may be created by embossing using the master impression or the mold carrying the negative impression. Polymers and curable liquid monomer formulas are often used as embossing materials.

The embossing process may be carried out by first thermally softening the polymer on the master impression or the negative mold to transfer the textures. Followed by a cooling period to solidify the polymer for easy removal. Curable liquid formulas of monomers or oligomers may also be used for embossing by pouring the liquid formula over the master impression or negative mold followed by curing to solidify the liquid formula. Curing can be carried out thermally or by irradiation or other methods depending upon the type of curing catalysts used in the liquid formulas. The master impression with negative impression may also be bandaged onto a roll and embossing can be carried out by roll-to-roll processing.

In one embodiment, the cellular structure 10 may be constructed on a film or a sheet substrate. This may be implemented in many different ways. The textures may be laminated on the substrate by laying the film or sheet substrate on a thermally softened polymer or liquid monomer formulas during embossing. Alternatively, the embossing material may be laminated onto the film or the sheet first, followed by embossing the textures to the softened polymer or the liquid monomer formula with the master impression or the negative mold. Again, a roll-to-roll process may also be used for high-speed fabrication.

Alternatively, the cellular structure may also be created directly with laser or chemical etching on a substrate such as metals, ceramics, glass, metal oxides or thermoplastics. Subsequent depositions of the essential layers create light trapping photovoltaic cells that are self-cleaning, anti-icing, and fouling resistant.

In one embodiment, the reflective layer 20 may be comprised of materials such as, but not limited to, silver, aluminum, or other similar metals and their alloys and may be deposited onto the surface of the cellular structure 10 by DC-sputtering, CVD or techniques known to one skilled in the art. One of the purposes of the reflective layer 20 is to reflect the lights that were not completely absorbed in the active layer 24.

A back-side electrode layer 22 may be comprised of materials such as, but not limited to, zinc oxide or indium tin oxide, which may be applied using various techniques including, for example, RF-sputtering, CVD, or techniques known to one skilled in the art. In one embodiment, when silver is used as a reflective layer, an additional electrode layer may not be necessary as the silver can function as both reflector as well as an electrode.

The photoactive semiconductor layer 24 may be comprised of materials such as, but not limited to, copper indium/gallium diselenide (CIGS), cadium telluride (CdTe), or amorphous silicon (a-Si) and is then deposited on top of back side electrode 22 with methods such as CVD, RF/DC-sputtering and other methods known to one skilled in the art.

A front side electrode layer 26 may be comprised of materials such as, but not limited to, zinc oxide or indium tin oxide and is applied with RF-sputtering, CVD or other techniques known to those skilled in the art.

In one embodiment, a protective layer 28 may comprise but is not limited to, a hydrophobic material that is also coated on top of the front-side electrode 26. The protective layer 28 may be comprised of inorganic materials such as silicones or silanes applied with coating or deposition methods. The protective layer 28 may also be composed of other conformal coatings. In one embodiment, the polymeric protective material may be generated by radiation curing monomers conformingly coated over the frontside electrode prior to curing. One example of a conformal coating method is to deposit monomers in a vapor phase created by vacuum evaporation, followed by radiation curing.

The cellular structures 10 on the substrate 18 can be further modified to have secondary nanotextures on the top surface 32 of the cell walls. It will be appreciated that the nanotexture surface may be disposed on the outer most coating of the cellular structure. Secondary nanotextures may also be added to the interior surfaces of the cells 12. A hydrophobic protective layer comprising secondary nanotextures that are employed on the solar cells created on a substrate with cellular structure allow the cell surface to become a superhydrophobic surface. In this application a "superhydrophobic surface" means a surface having an apparent water contact angle of greater than or equal to 130 degrees. Such a surface helps prevent the wetting of water. Water will bead up on such a surface and easily roll off in an inclined plane. This water roll-off property prevents the surface from fouling as dirt particles in the path are carried off when water beads run off. The non-wet superhydrophobic surface also resists to ice formation and corrosion due to water or moisture.

A superhydrophobic surface may be prepared as identified in U.S. Provisional Patent Application No. 61/374,761, filed on Aug. 18, 2010, to the same inventor and is incorporated by reference in its entirety.

Figure 4:
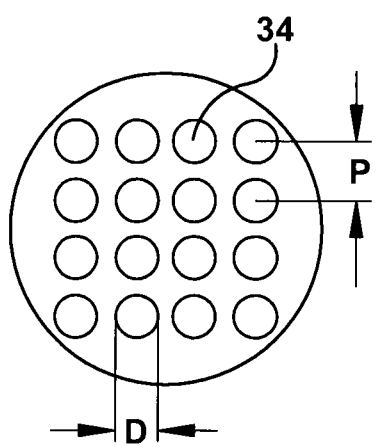
FIG. 4 illustrates a top view of a portion of the nanotextured surface.
Figure 5:
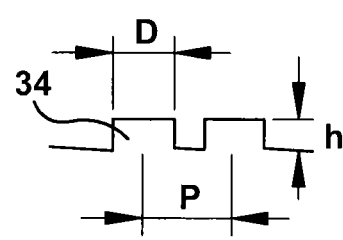
FIG. 5 illustrates a side view of a portion of the nanotextured surface.

Referring to the embodiments in FIGS. 3-5, a substrate useful to create a photovoltaic cell with a superhydrophobic surface is prepared by molding a cellular structure with flowable material onto a thermoplastic film or sheet. The cellular structure may comprise a primary texture of cells 12, which may be micron sized, with a secondary texture of nano-sized bumps 34 on the surface of the primary texture. The nano-sized bumps 34 may cover the entire cell walls or, at minimum, cover the top surface of the protruded cellular structure.

In one embodiment as shown in FIG. 3, cells 12 of 5-100 μm width by 5-100 μm width with a depth of 10-100 μm, resembling multiple wells tightly packed with walls joined with each other, can be produced by, for example, micro-embossing with a curable organic monomer compound or may be produced by micro-embossing with a silicone or any other suitable material. Cells of varying similar sizes not mentioned may also be produced. Nano-sized bumps 34 are molded on the top of the protruded cellular walls, where the texture is in contact with external objects. A thin layer of silver may be deposited as a reflector or as a back-side electrode or both, followed by a semiconductor layer and then a front-side electrode layer deposited in sequence. Then the surface may treated with plasma enhanced CVD using organosilanes, or any other known material, to create a hydrophobic layer.

In order to make a superhydrophobic surface, the surface textures and the material used for the surface must satisfy Cassie-Baxter Law, $\cos\theta_a = \phi_1(\cos\theta_1 + 1) - 1$, where $\theta_a$ is the apparent water contact angle, $\phi_1$ is the fraction of solid on the surface that in contact with water, and $\theta_1$ is the equilibrium water contact angle on the flat surface of the solid used. As used herein, a surface is considered to be superhydrophobic if it has an apparent water contact angle of about 130° or greater. In one embodiment, the surface has an apparent contact angle of about 150° or greater. Typically, a hydrophobic material with an equilibrium water contact angle on flat surface of 90° or greater is preferred.

When a hydrophilic material is used to assemble a similarly textured surface, it is likely that water will completely wet the surface, which is known as the Wenzel State. Even if the Cassie-Baxter Law is satisfied, the primary texture can still be wetted by Cassie impregnation, which is another wetting phenomenon that it is desirable to avoid. The critical contact angle of Cassie impregnation is governed by the equation $\cos\theta^* = (\theta_1 - 1)/(\gamma - \theta_1)$, where $\gamma$ is the roughness of surface. The equilibrium water contact angle of hydrophobic material must be greater than the critical contact angle $\theta^*$ to avoid Cassie impregnation.

Under normal conditions, water will not wet the surfaces that satisfy the above-mentioned conditions. However, those textures mimicking a lotus leaf's hills-and-valleys structure will still be wetted if pressure is applied to the water laying on the surface. The valleys in such a structure are interconnected. When an external pressure is applied, the equilibrium will be shifted as the air under water is forced out through the channels of the interconnected valleys.

In a structure in accordance with the present disclosure, the cells are individually separated from each other with cell walls 14 and 17. When a water drop is laid on the surface, air trapped in the cells is sealed. When the water drop is pressed the air in the cells is proportionally pressurized to maintain the equilibrium. The pressure in the cells prevents water from wetting the cells. Applicant has found, however, that while the cellular structure according to this invention will resist wetting by external pressure, the nanotexture on the surface can still enter into the Wenzel State of wetting due to the nanotexture's hills-and-valleys structure. Wetting in these very small areas may not prevent the surface from satisfying Cassie-Baxter Law, but it does increase the adhesion of water to the surface. The adhesion prevents water drops from rolling freely. The water drops will therefore drag on the surface and not be able to pick up dirt particles easily. The surface, therefore, loses self-cleaning property.

As described above, in one embodiment, the textured surface may have an apparent contact angel ($\theta_a$) of about 130° or greater. In another embodiment, the textured surface may have an apparent contact angle of about 150° or greater. In still another embodiment, the textured surface may have a critical contact angle of Cassie impregnation ($\theta^*$) of about 110° or less.

Referring to FIGS. 4 and 5, the nanotextures may be provided with a pitch (P), and the 2 respective bumps and protrusions may have a diameter (D) and a height (h). The droop of water sitting on top of a texture of hills-and-valleys may be described by the equation $(2^{1/2}P - D)^2/R$, where P is the pitch size, D is the diameter of bump, and R is the radius of water droplet. In one embodiment, the secondary texture satisfies the equation $(2^{1/2}P - D)^2/R < h$. By providing a bump or protrusion height that is greater than the droop size prevents wetting. When the droop size approaches the height of the bump, water will touch the bottom and wet the textures.

The dimensions of the textured surface may be chosen as desired for a particular application or intended use. In one embodiment, the primary cellular structure may be provided as a plurality of cubicles or walls of any selected shape including, but not limited to circular, square, rectangular, pentagonal, hexagonal, octagonal, and the like. The diameter, length, width, and/or depth (or height) of the walls defining the primary cellular structure may be selected as desired. In one embodiment, the dimensions of the primary cellular structure are individually from about 1 to about 1,000 microns (μm). The cells may have a symmetrical or non-symmetrical configuration.

In one embodiment, the secondary texture may be provided by bumps or protrusions having a selected shape. The shape of the bump is not limited and may be chosen as desired. For example, the bump or protrusion may have any regular or non-regular geometric shape including, but not limited to square, cubed, triangular, pyramidal, hexagonal, octagonal, hemi-spherical, circular, cylindrical, and the like. Additionally, the upper surface of the bump or protrusion may be substantially flat, rounded, curved, or non-uniform or irregular. In one embodiment, the diameter, length, width, and/or height of the protrusion may individually be from about 1 to 1,000 nanometers (nm).

In one embodiment cells resembling multiple wells tightly packed with walls joined with each other (such as shown, for example, in FIG. 1) may be provided having dimensions of 5-40 μm by 5-40 μm with a depth of 10-100 μm. The cells may be produced by micro-embossing with, for example, a silicone RTV or other curable monomer formulas. Cells of varying similar sizes not mentioned may also be produced. Nano-sized bumps 34 are molded on the top of the protruded cellular walls, where the texture is in contact with external objects.

A textured cellular structure surface may be provided by suitable molding techniques. A mold that has a negative impression of the structures according to above mentioned criterions can be made by lithographical etching or methods known to those skilled in the arts. A negative impression, or sometimes called a master, can also be made by imprinting from another mold fabricated with chemical etching or other methods. A textured cellular surface may be created by embossing using the master or the mold carrying negative impression. Embossing materials include, but are not limited to, polymers and curable liquid monomer formulas.

Embossing can be carried out by first thermally softening the polymer on the master to transfer the textures and followed by cooling to solidify the polymer for easy removal. Curable liquid formulas of monomers or oligomers can also be used for embossing by pouring the liquid formula over the master and followed by curing. Curing can be carried out by heating, irradiation, or other suitable methods depending upon the type of curing catalysts used in the formulas. The master with negative impression can be bandaged onto a roll and embossing can be carried out by a roll-to-roll process.

Suitable materials for making the textured surface include thermoplastic materials and thermoset materials. Room-temperature-vulcanizing (RTV) silicones are useful as embossing materials, as these materials exhibit good curing, and mold release properties. A non-limiting example of a suitable RTV silicon is RTV615 from Momentive Performance Materials, Inc. A UV curable silicone is also suitable as it can be cured substantially instantaneously.

The textured cellular surface may be constructed on a film or a sheet substrate. This can be implemented in a variety of ways. The textures can be laminated on the substrate by simply laying the substrate on the thermally softened polymer or the liquid monomer formulas during embossing. Alternatively, the embossing material can be laminated onto the film first and followed by embossing the textures on the softened polymer or liquid monomer formula with the master or negative mold. Again, roll-to-roll process can also be used for high-speed fabrication. The film or sheet is not particularly limited and may be chosen from a material including, but not limited to, thermo plastics, thermosets, glass, wood, metal, paper, or the like.

Once the substrate having nanotextures on the surface of the primary cellular structure is created, a layer deposited onto the surface of the cellular structure may comprise materials such as, but not limited to, silver, aluminum, or other similar metals and their alloys and may be deposited onto the surface of the cellular structure 10 by DC-sputtering, CVD or techniques known to one skilled in the art. One of the purposes of the reflective layer 20 is to reflect the light that is not completely absorbed in the active layer 24.

In another embodiment, a nano-textured surface may be provided by including nano-sized particles in the protective conformal coating layer. For example, in one embodiment the protective coating layer 28 may be provided with nano-sized particles. The particles may be, for example, about 500 nm or less. The nano particles may be, for example, silica, titanium oxide, aluminum oxide, other metal oxides, or combinations of two or more thereof. Using this method, there will be no need to create the secondary nanotexture on the primary cellular structure at the substrate level.

It will be appreciated that the back-side electrode layer 22, photoactive semiconductor layer 24, front side electrode layer 26, and protective layer 28 may each comprise materials and be formed as previously described herein.

I claim:

1. A light trapping photovoltaic cell comprising:
a substrate comprising a plurality of interconnected cells, each cell having a top region and a bottom region adjacent to the top region, the top region being defined by a plurality of generally vertical walls, wherein the bottom region comprises one or more walls pitched toward the center of the bottom of the cell, and wherein light enters the cell at the top region;
a reflector layer disposed over the walls of the cells;
a back side electrode disposed over reflector layer;
a photoelectric active layer disposed over the backside electrode; and
a front side electrode disposed over the active layer.

2. The light trapping photovoltaic cell of claim 1, wherein the bottom region has a rounded shape with the lowest point near the center of the bottom.

3. The light trapping photovoltaic cell of claim 1, further comprising a hydrophobic protective layer.

4. The light trapping photovoltaic cell of claim 1, further comprising a plurality of nano-sized bumps on exterior surfaces of the cell walls.

5. The light trapping photovoltaic cell of claim 4, wherein the cell surfaces exhibits a water contact angle of greater than 130°.

6. The light trapping photovoltaic cell of claim 1, further comprising a plurality of nano-sized bumps on interior surfaces of the cell walls.

7. The light trapping photovoltaic cell of claim 1, further comprising a plurality of nano-sized bumps on exterior and interior surfaces of the cell walls.

8. The light trapping photovoltaic cell of claim 7, wherein the cell surfaces exhibits superhydrophobicity.

9. The light trapping photovoltaic cell of claim 7, wherein the cell surfaces exhibits a water contact angle of greater than 130°.

10. The light trapping photovoltaic cell of claim 1, wherein a cell surface exhibits superhydrophobicity.

11. The light trapping photovoltaic cell of claim 3, wherein the hydrophobic protective layer comprises a conformal coating having nano-textured surface.

12. The light trapping photovoltaic cell of claim 1, wherein the substrate is chosen from at least one of a thermoplastic material, a thermoset material, a metal-containing material, a ceramic material and a glass.

13. The light trapping photovoltaics cell of claim 1, comprising a protective layer disposed about the front side electrode.

14. The light trapping photovoltaic cell of claim 13, wherein the protective layer comprises a plurality of nano-sized particles.

15. The light trapping photovoltaic cell of claim 14, wherein the nano-sized particles are chosen from silica, titanium oxide, aluminum oxide, or a combination of two or more thereof.

16. The light trapping photovoltaic cell of claim 1, wherein the bottom region comprises a wall extending from each of the plurality of generally vertical walls of the top region, and the walls of the bottom region pitch to the center of the bottom.

17. The light trapping photovoltaic cell of claim 1, wherein the plurality of vertical walls of the top region and the one or more walls of the bottom region define an angle ($\beta$), wherein $\beta$ may is greater than or equal to about 90° and less than 180°.

18. The light trapping photovoltaic cell of claim 1 having a perimeter, wherein the top region of the cells have about the same perimeter dimensions from a top of the generally vertical walls to a bottom of the generally vertical walls of the cells.

19. The light trapping photovoltaic cell of claim 1, wherein the walls of the top region of the cells have a thickness of from about 0.1 μm to about 100 μm.

20. The light trapping photovoltaic cell of claim 1, wherein the cells have a perimeter defining a geometric shape, and the bottom region of the cells are pitched toward the center of the geometric shape.

* * * * *